(12) United States Patent
Hosaka

(10) Patent No.: US 7,629,806 B2
(45) Date of Patent: Dec. 8, 2009

(54) METHOD FOR FORMING CONNECTION PIN, PROBE, CONNECTION PIN, PROBE CARD AND METHOD FOR MANUFACTURING PROBE CARD

(75) Inventor: Hisatomi Hosaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 55 days.

(21) Appl. No.: 11/885,936

(22) PCT Filed: Mar. 8, 2006

(86) PCT No.: PCT/JP2006/304441

§ 371 (c)(1),
(2), (4) Date: Sep. 7, 2007

(87) PCT Pub. No.: WO2006/095759

PCT Pub. Date: Sep. 14, 2006

(65) Prior Publication Data

US 2008/0284458 A1   Nov. 20, 2008

(30) Foreign Application Priority Data

Mar. 8, 2005   (JP) .............................. 2005-064327
Mar. 10, 2005   (JP) .............................. 2005-067155

(51) Int. Cl.
*G01R 31/02* (2006.01)
(52) U.S. Cl. .................. 324/762; 324/754; 324/761

(58) Field of Classification Search .................... None
See application file for complete search history.

(56) References Cited

U.S. PATENT DOCUMENTS

2007/0089551 A1 * 4/2007 Williams et al. ........... 73/866.5
2008/0150558 A1 * 6/2008 Amemiya et al. ........... 324/754

FOREIGN PATENT DOCUMENTS

| JP | 8-2617 | 1/1996 |
|---|---|---|
| JP | 8-201429 | 8/1996 |
| JP | 10-506197 | 6/1998 |
| JP | 11-258269 | 9/1999 |
| JP | 2000-077477 | 3/2000 |
| JP | 2000-346878 | 12/2000 |
| JP | 2003-215161 | 7/2003 |
| JP | 2004-117215 | 4/2004 |
| JP | 2004-340617 | 12/2004 |
| JP | 2004-356467 | 12/2004 |
| WO | WO 96/15458 | 5/1996 |

* cited by examiner

*Primary Examiner*—Minh N Tang
(74) *Attorney, Agent, or Firm*—Finnegan, Henderson, Farrabow, Garrett & Dunner LLP

(57) ABSTRACT

A probe which can be easily formed, is not limited in a mounting position and number, and capable of sufficiently securing a space allowing a contact to move is provided. The probe has a contact to be brought into contact with an inspection object, and a beam part supporting the contact at a tip end portion. A rear portion of the beam part of the probe is joined to a surface at an inspection object side, of a contractor disposed to be opposed to the inspection object. The beam part of the probe is bent so that the above described contact at the tip end portion inclines to the above described inspection object side.

7 Claims, 11 Drawing Sheets

METHOD FOR FORMING CONNECTION PIN, PROBE, CONNECTION PIN, PROBE CARD AND METHOD FOR MANUFACTURING PROBE CARD

CROSS REFERENCE TO RELATED APPLICATIONS

This application is a National Phase Application of International Application Number PCT/JP2006/304441, filed Mar. 8, 2006, and claims the priority of Japanese Patent Application Nos. 2005-064327, filed Mar. 8, 2005, and 2005-067155, filed Mar. 10, 2005, the content of all of which are incorporated herein by reference.

TECHNICAL FIELD

The present invention relates to a method for forming a connection pin for achieving electrical continuity between a main body member and an external member opposed to the main body member, a connection pin formed by the forming method, a probe, a probe card for conducting inspection of electric characteristics of an inspection object, and a method for manufacturing the probe card.

BACKGROUND ART

Inspection of the electric characteristics of electronic circuits such as an IC and an LSI formed on, for example, a semiconductor wafer is conducted by using a probe card fitted to a prober. A probe card generally has a circuit board and a contactor. A number of probes are supported on an undersurface of a contactor opposed to a wafer, and the probe is constructed by, for example, a contact to be brought into contact with the wafer, and a beam part which supports the contact at its tip end portion, is slim and long, and has flexibility and elasticity. Inspection of the electric characteristics of a wafer is conducted by bringing contacts of a plurality of probes into contact with each of electrodes of the electronic circuit.

In order to conduct inspection of the electric characteristics properly, it is necessary to bring each of the contacts of a plurality of probes into contact with a wafer at a constant pressure, and when differences exist in distance between the respective probes and the wafer, such differences have to be absorbed. Therefore, it is necessary to give sufficient flexibility to the beam part of each of the probes, and a space allowing the contacts to move has to be sufficiently secured for realizing sufficient mobility of the contacts in the direction of the wafer.

Conventionally, in order to attain such an object, a support post 201 having a certain height is formed at an electrode 200a on an undersurface of a contactor 200, and a beam portion 202a of a probe 202 is joined to the support post 201, as shown in, for example, FIG. 17. Thereby, a contact 202b can move to the contactor 200 side, and a space allowing the contact 202b to move is secured (see Patent Document 1). As another method, a recessed portion 203 in a concave shape is formed at an undersurface side of the contactor 200 as shown in, for example, FIG. 18, and a space allowing the contact 202b to move is secured (see Patent Document 2).

However, in the case of joining the probe to the support post of the contactor as in the former, a number of support posts having certain heights have to be formed corresponding to the number of probes in an extremely narrow and small area in the undersurface of the contactor, and therefore, it is technically very difficult to form the position and shape of each of the support posts with high accuracy. In the case of forming the recessed portion in the contactor as in the latter, wiring for passing electricity to the probe cannot be provided at that portion, and therefore, degree of freedom of design of wiring in the contactor is lost, thus limiting the installing positions and the number of probes.

Incidentally, in a probe card, a circuit board is overlapped on a contactor supporting probes. Inspection of the electric characteristics of a wafer is conducted by bringing a plurality of probes into contact with the electrodes of the electronic circuit of the wafer, and by applying an electric signal for inspection to each of the electrodes of the electronic circuit from each of the probes through the circuit board and the contactor.

Since inspection of the electric characteristics is conducted in a wide range of temperature region of, for example, minus 20° C. to 150° C., it sometimes happens that a circuit board expands and contracts due to, for example, thermal influence at the time of inspection, and flatness and horizontality of the circuit board are sometimes reduced. Therefore, electrical contact of the circuit board and the contactor becomes unstable in the circuit board or the contactor surface, and inspection is not sometimes conducted properly. In order to solve such a problem, it is proposed at present to dispose an interposer constituted of a board with interconnection elements in spring form mounted on a top and a bottom surfaces between a contactor and a circuit board, for example (see Patent Document 3).

However, when the interposer constituted of a plurality of members as described above is mounted between the circuit board and the contactor, the structure of the entire probe card is complicated. Since the above described interposer takes a width in the vertical direction, for example, the contactor and the circuit board separate from each other, and the entire probe card becomes large in size. Further, it is necessary to form a spring in a specific shape, mount the spring on the top and the bottom surfaces of the base board, and mount the base board to a specific position between the circuit board and the contactor precisely, and therefore, manufacture of the probe card becomes difficult.

[Patent Document 1] Japanese Patent Application Laid-open No. 2003-215161

[Patent Document 2] Japanese Patent Application Laid-open No. 2000-346878

[Patent Document 3] Translated National Publication of Patent Application No. Hei 10-506197 (FIG. 5)

DISCLOSURE OF THE INVENTION

Problems to be Solved by the Invention

The present invention is made in view of the above respect, and has an object to provide a method for forming a connection pin such as a probe capable of being mounted with a relatively simple technique, and sufficiently securing a space allowing a contact to move, a connection pin and a probe card formed by the forming method.

Further, the present invention has an object to provide a compact probe card which has a simpler construction than a conventional one, and is easy to manufacture, and a method for manufacturing the probe card.

Means for Solving the Problems

In order to attain the above described objects, the present invention is a method for forming a connection pin connected to an electrode on a surface of a main body member to achieve electrical continuity between the main body member and an external member opposed to the main body member, and has the steps of forming a protruded part on the surface of the main body member, and disposing a connection pin on the aforesaid protruded part on the surface of the aforesaid main body member, pressing a bonding tool for joining against a rear portion of the connection pin from a side of the aforesaid external member, and while joining the rear portion of the connection pin to the electrode on the surface of the main body member, bending a tip end portion of the aforesaid connection pin to the side of the aforesaid external member with a contact point of the aforesaid connection pin and the aforesaid protruded part as a support point.

In the above described method for forming a connection pin, the aforesaid connection pin is a probe for inspecting electric characteristics of an inspection object, the aforesaid probe has a contact to be brought into contact with the inspection object, and a beam part supporting the contact at a tip end portion, the aforesaid external member is the inspection object, the aforesaid main body member is a contactor which is disposed to be opposed to the aforesaid inspection object, the aforesaid protruded part is formed on a surface of the aforesaid contactor at an inspection object side, and the aforesaid beam part is disposed on the aforesaid protruded part on the surface of the aforesaid contactor at the inspection object side, a bonding tool for joining is pressed against a rear portion of the beam part from the inspection object side, and while the rear portion of the beam part is joined to the contactor, the aforesaid beam part may be bent so that the aforesaid contact inclines to the inspection object side with a contact point of the aforesaid beam part and the aforesaid protruded part as a support point.

According to the present invention, the beam part of the formed probe is bent so that the contact inclines to the inspection object side, and therefore, a sufficient space for allowing the contact to move is secured between the contact and the contactor. Further, the beam part is bent while the probe is joined to the contactor by using the bonding tool, and therefore, formation and mounting of the probe can be easily performed. Further, since the aforesaid beam part is bent with the contact point with the protruded part as the support point, the bent angle of the beam part depends on the height of the protruded part, and the bent angle of the beam part can be made constant. As a result, the height of the contact with respect to the contactor can be made constant, and the movable ranges of the contacts of a plurality of probes formed on the contactor, for example, can be made uniform.

Further, the above described method for forming a connection pin may have the step of forming, on the surface of the aforesaid contactor at the inspection object side, another protruded part which holds an end surface of the rear portion of the aforesaid beam part so that a position of the aforesaid beam part does not displace to the rear side when the rear portion of the beam part is pressed by the aforesaid bonding tool. Since in this case, the position of the beam part does not displace, the bent position and the joining position to the contactor of the beam part become constant, and the height of the contact at the tip end of the beam part becomes constant. As a result, the heights of the contacts in a plurality of probes joined to the contactor, for example, are made uniform, and contact of each of the contacts to the inspection object can be performed uniformly at a constant pressure.

Further, in the above described method for forming a connection pin, the aforesaid connection pin is used for a probe card having a contactor supporting a probe on one surface, and a circuit board which is opposed to the other surface of the contactor and electrically connected to the contactor, the aforesaid main body member is the aforesaid contactor, the aforesaid external member is the aforesaid circuit board which is disposed with a gap provided between the circuit board and the other surface of the aforesaid contactor, the aforesaid protruded part is formed on the other surface of the contactor, and the connection pin is disposed on the aforesaid protruded part on the other surface of the aforesaid contactor, the bonding tool for joining is pressed against the rear portion of the connection pin from the circuit board side, and while the rear portion of the connection pin is joined to the other surface of the contactor, the aforesaid connection pin may be bent so that the tip end portion of the aforesaid connection pin inclines to the circuit board side with the contact point of the aforesaid connection pin and the aforesaid protruded part as the support point.

In the above described method for forming a connection pin, the aforesaid connection pin is used for a probe card having a contactor supporting a probe on one surface, and a circuit board which is opposed to the other surface of the contactor and electrically connected to the contactor, the aforesaid external member is the aforesaid contactor, the aforesaid main body member is the aforesaid circuit board which is disposed with a gap provided between the circuit board and the other surface of the aforesaid contactor, the aforesaid protruded part is formed on a surface of the circuit board at a contactor side, the connection pin is disposed on the aforesaid protruded part on the surface of the aforesaid circuit board at the contactor side, the bonding tool for joining is pressed against the rear portion of the connection pin from the circuit board side, and while the rear portion of the connection pin is joined to the surface of the circuit board at the contactor side, the aforesaid connection pin may be bent so that the tip end portion of the aforesaid connection pin inclines to the contactor side with the contact point of the aforesaid connection pin and the aforesaid protruded part as the support point.

Further, in the above described method for forming a connection pin, the aforesaid main body member is a package which covers an electronic device, and the aforesaid external member is a wiring board on which the package is mounted.

The present invention according to another aspect is a probe which has a contact to be brought into contact with an inspection object and a beam part supporting the contact at a tip end portion, and is for inspecting electric characteristics of the inspection object, and the aforesaid probe is supported at a contactor opposed to the inspection object, and is formed by the following forming method. The aforesaid forming method has the steps of forming a protruded part on a surface of the contactor at an inspection object side, and disposing the aforesaid beam part on the aforesaid protruded part on the surface of the aforesaid contactor at the inspection object side, pressing a bonding tool for joining against a rear portion of the beam part from the inspection object side, and while joining the rear portion of the beam part to the contactor, bending the aforesaid beam part so that the aforesaid contact inclines to the inspection object side with a contact point of the aforesaid beam part and the aforesaid protruded part as a support point.

According to the present invention, the rear portion of the beam part of the probe is joined to the contactor, and the beam part is bent so that the contact inclines to the inspection object side. Therefore, a sufficient space for allowing the contact to move can be secured between the contact and the contactor. According to the present invention, it is not necessary to form a high support post for a probe and to form a recessed part as in the conventional arts. Therefore, the probe can be mounted with the simple technique, and wiring of the contactor is not limited.

The present invention according to another aspect is a connection pin disposed in a gap between a contactor and a circuit board and electrically connecting the contactor and the circuit board, in a probe card having the contactor supporting a probe on one surface and the circuit board opposed to the other surface of the contactor and electrically connected to the contactor, and is formed by the following forming method. The aforesaid forming method has the steps of forming a protruded part on the other surface of the contactor, and disposing the connection pin on the aforesaid protruded part on the other surface of the aforesaid contactor, pressing a bonding tool for joining against a rear portion of the connection pin from a circuit board side, and while joining the rear portion of the connection pin to the other surface of the contactor, bending the aforesaid connection pin so that a tip end portion of the aforesaid connection pin inclines to the circuit board side with a contact point of the aforesaid connection pin and the aforesaid protruded part as a support point.

The present invention according to another aspect is a connection pin disposed in a gap between a contactor and a circuit board and electrically connecting the contactor and the circuit board, in a probe card having the contactor supporting a probe on one surface and the circuit board opposed to the other surface of the contactor and electrically connected to the contactor, and is formed by the following forming method. The aforesaid forming method has the steps of forming a protruded part on a surface of the circuit board at a contactor side, disposing the connection pin on the aforesaid protruded part on the surface of the aforesaid circuit board at the contactor side, pressing a bonding tool for joining against a rear portion of the connection pin from the contactor side, and while joining the rear portion of the connection pin to the surface of the circuit board at the contactor side, bending the aforesaid connection pin so that a tip end portion of the aforesaid connection pin inclines to the contactor side with a contact point of said connection pin and the aforesaid protruded part as a support point.

The present invention according to another aspect is a connection pin connected to an electrode on a surface of a package to achieve electrical continuity between the package covering an electronic device and a wiring board on which the package is mounted, and is formed by the following forming method. The aforesaid forming method has the steps of disposing the aforesaid package and wiring board to be opposed to each other, forming a protruded part on the surface of the package at a wiring board side, disposing the connection pin on the aforesaid protruded part on the surface of the aforesaid package, pressing a bonding tool for joining against a rear portion of the connection pin from the aforesaid wiring board side, and while joining the rear portion of the connection pin to the electrode on the surface of the package, bending a tip end portion of the aforesaid connection pin to the aforesaid wiring board side with a contact point of the aforesaid connection pin and the aforesaid protruded part as a support point.

The present invention according to another aspect is a probe card having a contactor disposed to be opposed to an inspection object and a probe joined to a surface of the aforesaid contactor at an inspection object side, wherein the aforesaid probe has a contact to be brought into contact with the inspection object, and a beam part supporting the contact at a tip end portion, a rear portion of the aforesaid beam part is joined to the aforesaid contactor, the aforesaid beam part is bent so that the aforesaid contact at the tip end portion inclines to the aforesaid inspection object side, and a protruded part which is in contact with a rear surface of the aforesaid bent beam part at a contactor side is formed on the surface of the aforesaid contactor at the inspection object side.

According to the present invention, the rear portion of the beam part of the probe is joined to the contactor, and the beam part is bent so that the contact inclines to the inspection object side. Therefore, a sufficient space for allowing the contact to move is secured between the contact and the contactor. Further, since the protruded part is formed on the surface of the contactor at the inspection object side, for example, the beam part is disposed to sandwich the protruded part with the contact, and while the bonding tool for joining is pressed against the rear portion of the beam part from the inspection object side to join the rear portion of the beam part to the contactor, the beam part can be bent so that the aforesaid contact inclines to the inspection object side with the contact point of the aforesaid beam part and the aforesaid protruded part as the support point. In this manner, formation and mounting of the probe can be easily performed. Further, since the aforesaid beam part is bent with the contact point with the protruded part as the support point, the bent angle of the beam part depends on the height of the protruded part, and the bent angle of the beam part can be made constant. As a result, the height of the contact at the tip end of the beam part can be made constant, and the movable ranges of the contacts of a plurality of probes formed on the contactor, for example, can be made uniform.

Another protruded part which holds an end surface of the rear portion of the aforesaid beam part may be formed on the surface of the aforesaid contactor at the inspection object side.

The present invention according to another aspect is a probe card having a contactor supporting a probe on one surface, and a circuit board opposed to the other surface of the contactor and electrically connected to the contactor, wherein a gap is formed between the contactor and the circuit board, a connection pin which electrically connects the contactor and the circuit board and has elasticity is provided at the aforesaid gap, and the aforesaid connection pin has one end portion joined to the other surface of the aforesaid contactor, and the other end portion pressed to abut on a surface of the aforesaid circuit board at a contactor side.

According to the present invention, the one end portion of the connection pin having elasticity is joined to the contactor, and the other end portion is pressed to abut on the circuit board. Therefore, even when flatness and horizontality of the circuit board, for example, reduce, the distortion of the circuit board is absorbed by the elasticity of the connection pin and continuity of the circuit board and the contactor can be maintained. Further, since the distortion of the circuit board is absorbed by the connection pin, horizontality of the contactor is kept, and inspection of the inspection object can be properly performed by each of a plurality of probes supported within the contactor surface, for example. Since such an effect can be realized by the connection pin, the construction of the probe card is simplified as compared with the conventional one, and manufacture of the probe card is further facilitated. The connection pin does not take a large space, and therefore, the probe card can be made compact.

The aforesaid connection pin has the one end portion joined along the other surface of the aforesaid contactor, and the other end portion side from the joint portion is bent to a side of the aforesaid circuit board.

A protruded part which is in contact with a rear surface of the aforesaid bent connection pin at a contactor side may be formed on the other surface of the aforesaid contactor. In such a case, for example, when the connection pin is joined to the contactor by using the bonding tool for joining, the connection pin is disposed on the other surface of the contactor so as to sandwich the protruded part with the contactor, and while the bonding tool is pressed against the one end portion of the connection pin to join the one end portion of the connection pin to the contactor, the aforesaid connection pin can be bent so that the other end portion of the aforesaid connection pin inclines to the circuit board side with the contact point of the aforesaid connection pin and the aforesaid protruded part as the support point. In this manner, formation and joining of the bent connection pin can be easily performed. Further, since the connection pin is bent with the contact point with the protruded part as the support point, the bent angle of the connection pin depends on the height of the protruded part, and the bent angle of the connection pin can be made constant. As a result, the shape of the connection pin can be made constant. Therefore, the shapes of a plurality of connection pins provided at the probe card, for example, are made uniform, and the contact pressure of each of the connection pins to the circuit board can be made constant.

Another protruded part which holds an end surface of the aforesaid connection pin at the other end portion side may be formed on the other surface of the aforesaid contactor. In such a case, when, for example, the bonding tool is pressed against the one end portion of the connection pin to join it to the other surface of the contactor, the position of the connection pin can be prevented from displacing to the one end portion side. As a result, the bent position and the joining position to the contactor of the connection pin by the bonding tool, for example, become constant, and therefore, the connection pin can be formed into a constant shape.

The present invention according to another aspect is a method for manufacturing a probe card having a contactor supporting a probe on one surface and a circuit board opposed to the other surface of the contactor and electrically connected to the contactor, and has the steps of forming a protruded part on the other surface of the contactor, disposing the connection pin on the other surface of the aforesaid contactor to sandwich the aforesaid protruded part with the other surface, pressing a bonding tool for joining against one end portion of the connection pin from a circuit board side, and while joining the one end portion of the connection pin to the other surface of the contactor, bending the aforesaid connection pin so that the other end portion of the aforesaid connection pin inclines to the circuit board side with a contact point of the aforesaid connection pin and the aforesaid protruded part as a support point, and bringing the aforesaid circuit board into contact with the other end portion of the aforesaid connection pin.

According to the present invention, the connection pin is bent while being joined to the contactor by the bonding tool, formation and mounting of the connection pin can be easily performed in a short time. Further, since the connection pin is bent with the contact point with the protruded part as the support point, the bent angle of the connection pin depends on the height of the protruded part, and the bent angle of the connection pin can be made constant. As a result, the shape of the connection pin can be made constant. Therefore, the shapes of a plurality of connection pins provided at the probe card, for example, are made uniform, and the contact pressure of each of the connection pin to the circuit board can be made constant.

The above described method for manufacturing a probe card may have the step of forming, on the other surface of the aforesaid contactor, another protruded part which holds an end surface of the aforesaid connection pin at one end portion side so that a position of the aforesaid connection pin does not displace to the one end portion side when the one end portion of the connection pin is pressed by the aforesaid bonding tool.

EFFECT OF THE INVENTION

According to the present invention, the probe can be mounted with the simple technique, the mounting position and the number are not limited, and a space for allowing a contact to move can be sufficiently secured.

Further, according to the present invention, the probe card has the simple construction, becomes compact and easy to manufacture.

EXPLANATION OF CODES

1 PROBER
2 PROBE CARD
10 PROBE
10a BEAM PART
10b CONTACT
10c REAR PORTION
11 CONTACTOR
11c CONNECTING TERMINAL

20 FIRST PROTRUDED PART
21 SECOND PROTRUDED PART
W WAFER

BEST MODE FOR CARRYING OUT THE
INVENTION

Figure 1:
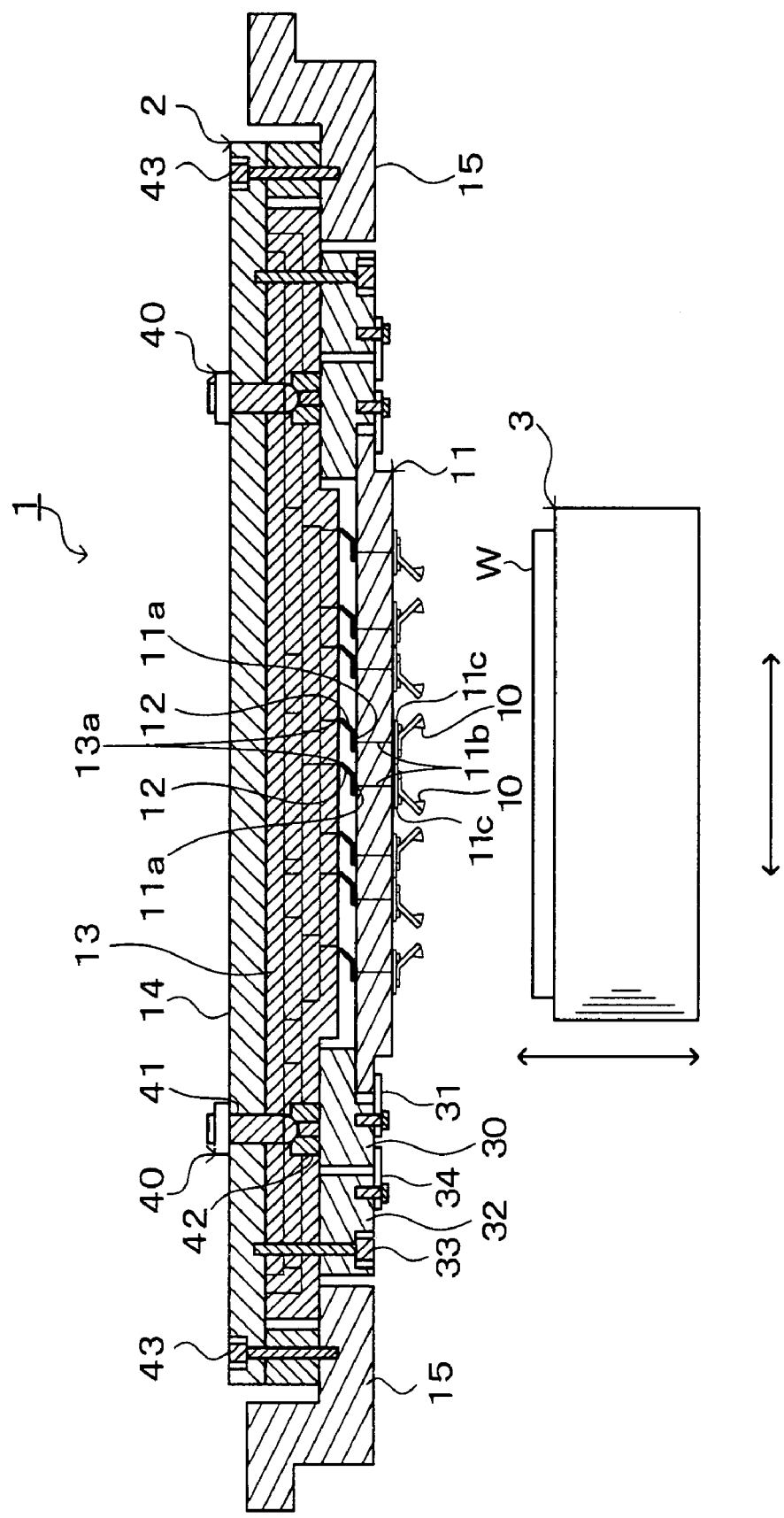
FIG. 1 is an explanatory view of a longitudinal section showing the outline of the construction of a prober.
Figure 2:
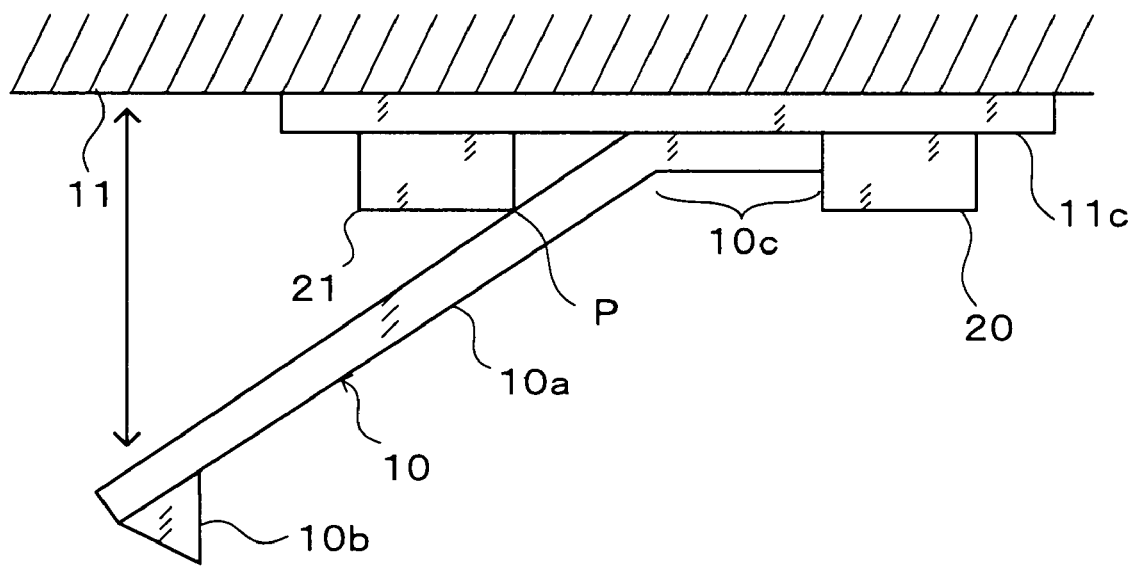
FIG. 2 is an explanatory view of a longitudinal section showing the construction of a mounting portion of a probe.

Preferred embodiments of the present invention will now be described. FIG. 1 is an explanatory view of a longitudinal section showing the outline of a construction of an inside of a prober 1 in a first embodiment.

In the prober 1, for example, a probe card 2, and a mounting table 3 for mounting a wafer W as an inspection object are provided. The probe card 2 includes a contactor 11 as a main body member which supports probes 10 as a plurality of connection pins, for example, a printed wiring board 13 as a circuit board which is electrically connected to the contactor 11 by a plurality of contact pins 12, and a reinforcing member 14 which reinforces the printed wiring board 13. The probe card 2 is fitted to the prober 1 by a card holder 15.

The reinforcing member 14 is provided to cover a top surface of, for example, the printed wiring board 13 to inhibit the printed wiring board 13 from thermally deforming. The contactor 11 is disposed under a lower side of the printed wiring board 13 with a gap provided at a lower side of the printed wiring board 13. A plurality of contact pins 12 having flexibility and elasticity are interposed between the printed wiring board 13 and the contactor 11, and a connecting terminal 13a of the printed wiring board 13 and a connecting terminal 11a of the contactor 11 are electrically connected by the contact pin 12. In the contact pin 12, for example, a lower portion is joined to the connecting terminal 11a of the contactor 11, a portion in the vicinity of a central portion is bent to the printed wiring board 13 side, and an upper portion is pressed in contact with the connecting terminal 13a of the printed wiring board 13. When the printed wiring board 13 is slightly inclined by, for example, thermal expansion, inclination of the printed wiring board 13 is absorbed by deflection of a plurality of contact pins 12. Thereby, horizontality of the contactor 11 is kept, and electrical connection of the contactor 11 and the printed wiring board 13 is maintained.

A plurality of connecting terminals (electrodes) 11c which are connected to the connecting terminals 11a on the top surface by a connecting wire 11b are formed on an undersurface of the contactor 11 at the mounting table 3 side. The probe 10 is jointed to each of the connecting terminals 11c.

The probe 10 has a beam part 10a which is slim and long and has flexibility and elasticity, and a contact 10b supported at a tip end portion of the beam part 10a to face downward. The beam part 10a and the contact 10b are formed by metal having conductivity, and the probe 10 gives and receives electric signals via the contactor 11, the contact pin 12 and the printed wiring board 13 by bringing the contact 10b into contact with the wafer W, and can inspect the electric characteristics of the electronic circuit on the wafer W. Note that the wafer W corresponds to the external member in the first embodiment.

Two protruded parts 20 and 21 spaced at a predetermined distance are formed on each of the connecting terminals 11c on the undersurface of the contactor 11. On the surface of the connecting terminal 11c between the first protruded part 20 and the second protruded part 21, a rear portion 10c in the beam part 10a of the probe 10 is bonded horizontally over a predetermined width. A rear end surface of the rear portion 10c of the beam part 10a abuts on an inner side surface of the first protruded part 20. The beam part 10a of the probe 10 is bent to a lower side where the mounting table 3 is located toward a tip end where the contact 10b is located from the rear portion 10c joined to the connecting terminal 11c. A rear surface of the beam part 10a at the contactor 11 side is in contact with the second protruded part 21 and a bent angle of the beam part 10a is defined by the height of the second protruded part 21. The probe 10 deflects to the upper side with a contact point P with the second protruded part 21 as a support point and can move the contact 10b in the vertical direction.

As shown in FIG. 1, a first outer peripheral member 30 formed along an outer periphery of the contactor 11, for example, is disposed at the outer periphery of the contactor 11. A plate spring 31 which presses the contactor 11 to the printed wiring board 13 side and holds it is mounted to the first outer peripheral member 30. For example, a second outer peripheral member 32 is further disposed at an outer periphery of the first outer peripheral member 30. The second outer peripheral member 32 is fixed to a reinforcing member 14 by, for example, a bolt 33 which penetrates through the printed wiring board 13 from an undersurface of the second outer peripheral member 32 to reach the reinforcing member 14. A plate spring 34 which presses the first outer peripheral member 30 to the printed wiring board 13 side and holds it is mounted to the second outer peripheral member 32.

For example, pressure regulating mechanisms 40 are provided at a top surface of the reinforcing member 14. The pressure regulating mechanisms 40 have, for example, bolts 41 which penetrate through the reinforcing member 14 from the top surface of the reinforcing member 14 to reach the printed wiring board 13, and receiving members 42 which are fixed to the top surface of the first outer peripheral member 30 and receive tip end portions of the bolts 41, at a plurality of spots. The heights of the printed wiring board 13 and the first outer peripheral member 30 are adjusted by turning the bolts 41, so that parallelism of the probes 10 on the contactor 11 and the wafer W can be adjusted. The reinforcing member 14 is fixed to the card holder 15 by bolts 43 provided at a plurality of spots of the outermost periphery of the reinforcing member 14.

The mounting table 3 is constructed to be movable, for example, laterally and vertically, and is capable of moving the wafer W mounted thereon three-dimensionally and bringing the contact 10b of the probe 10 into contact with a desired position on the wafer W.

Figure 3:
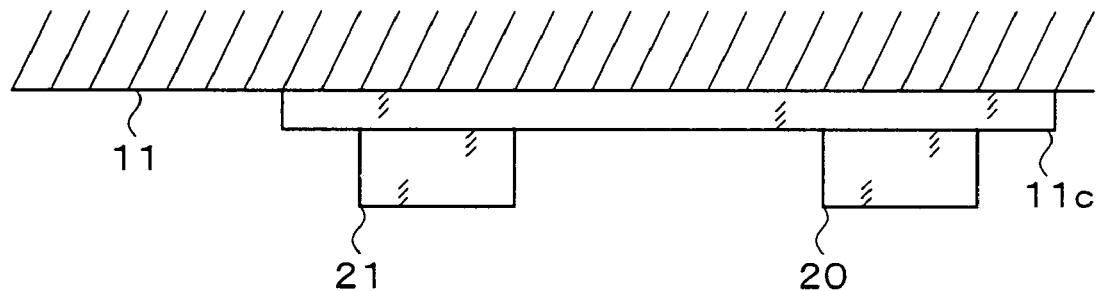
FIG. 3 is an explanatory view showing the state in which a protruded part is formed on an undersurface of a contactor.

Next, a method for forming the above described probe 10 will be described. First, a pair of the first protruded part 20 and the second protruded part 21 spaced at a constant distance are formed on the surface of each of the connecting terminals 11c of the contactor 11 as shown in, for example, FIG. 3. The first protruded part 20 and the second protruded part 21 are formed at a predetermined space with a predetermined height by using, for example, photolithography technique. The first protruded part 20 and the second protruded part 21 are formed by using a material harder than, for example, nickel, and plating of gold or the like is applied to their surfaces.

Figure 4:
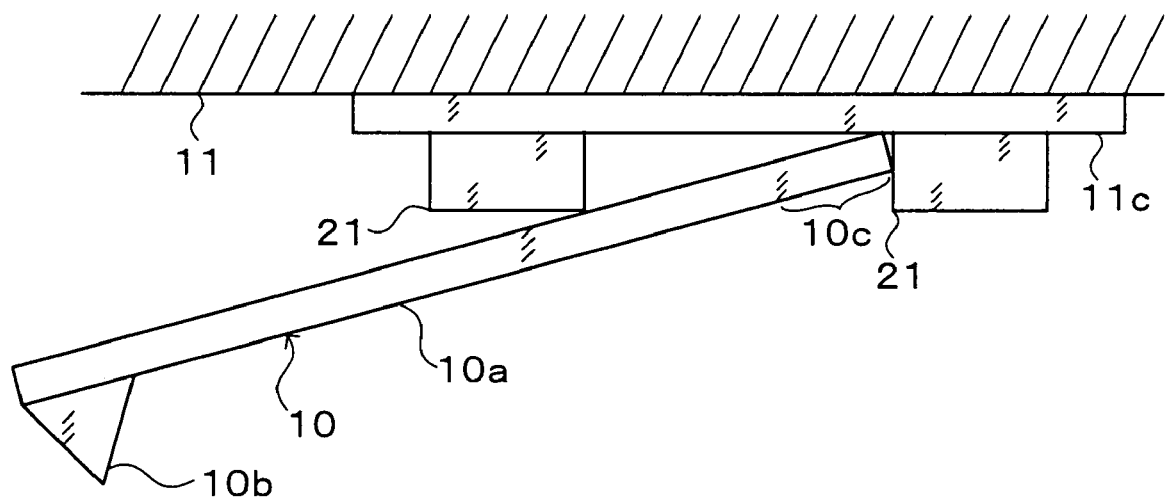
FIG. 4 is an explanatory view showing the state in which the probe is disposed on the undersurface of the contactor.

After the first protruded part 20 and the second protruded part 21 are formed on the surface of the connecting terminal 11c, the probe 10 in the state in which the beam part 10a is linear and not bent is disposed on the connecting terminal 11c as shown in FIG. 4, the rear portion 10c of the probe 10 is put into a recessed portion between the first protruded part 20 and the second protruded part 21, and the rear surface of the beam part 10a is brought into contact with the second protruded part 21. Namely, the beam part 10a is disposed to sandwich the second protruded part 21 between the beam part 10a and the surface of the contactor 11.

Figure 5:
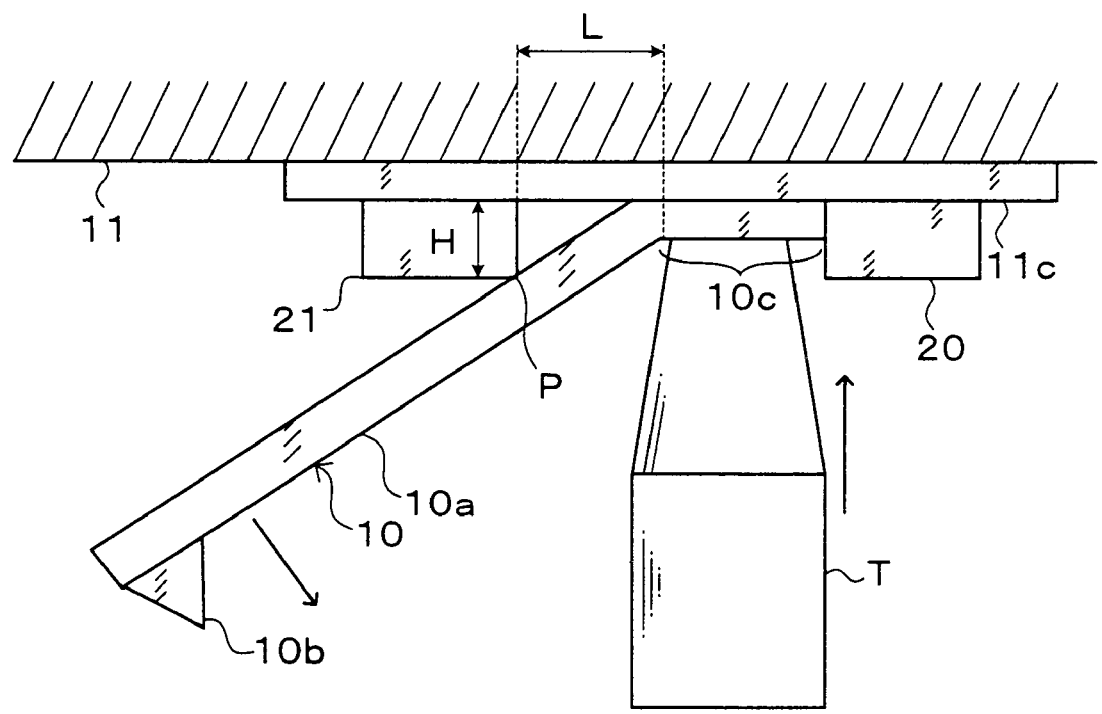
FIG. 5 is an explanatory view showing the state in which the probe is joined to the contactor with a bonding tool and is bent.

Thereafter, for example, an ultrasonic bonding tool T of, for example, a wire bonder is pressed against the rear portion 10c of the probe 10 from a lower position at the mounting table 3 side as shown in FIG. 5, and the rear portion 10c of the probe 10 is joined to the connecting terminal 11c by applying supersonic waves. On this occasion, by pressure of the ultrasonic bonding tool T, the beam part 10a is plastically deformed and bent with the contact point P of the beam part 10a and the second protruded part 21 as the support point. When the ultrasonic bonding tool T is pressed against the rear portion 10c, the end surface of the rear portion 10c of the beam part 10a is pressed by the first protruded part 20 so that the beam part 10a is prevented from displacing to the rear side. Since the bent angle of the beam part 10a is determined by a distance L in the horizontal direction from the bent point of the beam part 10a to the second protruded part 21 and a height H of the second protruded part 21, and the movable range of the contact 10b is fixed, the height of the second protruded part 21 and the pressing position of the ultrasonic bonding tool T are set so that the distance L and the height H have desired values.

Figure 6:
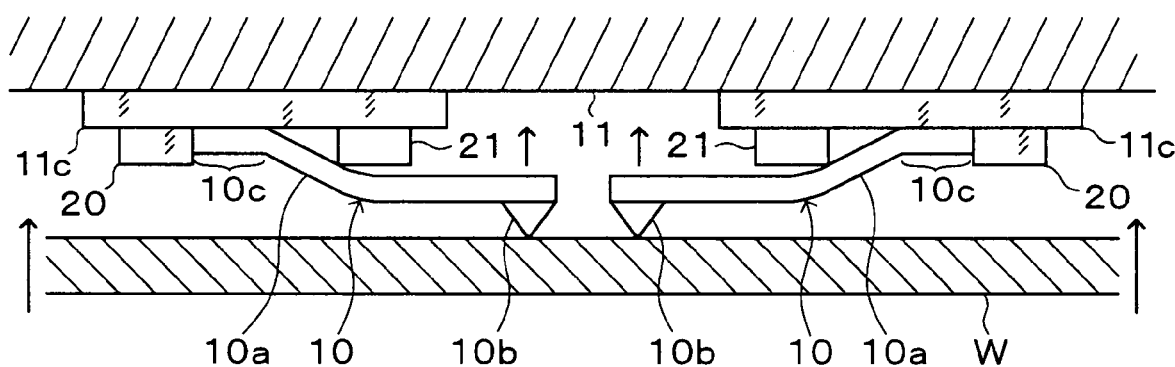
FIG. 6 is an explanatory view showing the state in which the probe and a wafer are in contact with each other on inspection of the electric characteristics of the wafer.

When the wafer W is mounted on the mounting table 3, and the electric characteristics of an electronic circuit on the wafer W are inspected by the probe card 2, for example, the wafer W is raised to the contactor 11 side, and the wafer W is pressed against the contact 10b of each of the probes 10 as shown in FIG. 6. Thereby, the beam part 10a of the probe 10 deflects to an upper side, the contact 10b moves to the upper side, and contact of the contact 10b and the surface on the wafer W is kept by the repulsive force.

According to the above embodiment, the rear portion 10c of the beam part 10a of the probe 10 is joined to the contactor 11, and the tip end side of the beam part 10a is bent. Therefore, the space allowing the contact 10b of the probe 10 to move in the vertical direction can be secured with a relatively simple construction without providing a recessed portion or a high support post in the contactor 11 as the conventional probe cards. As a result, even when parallelism of the contactor 11 and the wafer W, for example, is reduced, contact of the wafer W and each of the contacts 10b is secured in the entire surface of the wafer by pressing the wafer W against the contactor 11 side, and inspection of the electric characteristics can be properly conducted.

Since the second protruded part 21 with a predetermined height is formed at the connecting terminal 11c of the contactor 11 when forming the probe 10, the beam part 10a can be bent with the contact point P of the beam part 10a and the second protruded part 21 as the support point when pressing the rear portion 10c of the probe 10 by the ultrasonic bonding tool T. Thereby, the bent angles of the beam parts 10a of a plurality of probes 10 in the contactor 11 are made uniform, and the height of the contact 10b can be made uniform. Since the first protruded part 20 is formed at the connecting terminal 11c, positional displacement of the probe 10 can be prevented at the time of joining by the ultrasonic bonding tool T. As a result of this, the pressing position the ultrasonic bonding tool T to the beam part 10a and the joint position are constant, and the bent position of the beam part 10a becomes constant. Therefore, the height of the contact 10b of each of the probes 10 can be made uniform more exactly.

In the above embodiment, on forming the probe 10, the rear portion 10c of the beam part 10a is pressed with the ultrasonic bonding tool T, and the rear portion 10c of the beam part 10a is joined to the connecting terminal 11c while the beam part 10a is being bent. However, the bonding tool T is pressed against the rear portion 10c of the beam part 10a, and while the beam part 10a is being bent, the rear portion 10c may be temporarily joined to the connecting terminal 11c by applying weak ultrasonic waves to the rear portion 10c of the beam part 10a, after which, the rear portion 10c may be fully joined to the connecting terminal 11c by applying strong ultrasonic waves to the rear portion 10c of the beam part 10a again by the ultrasonic bonding tool T.

One example of the first embodiment of the present invention is described above, but the present invention can adopt various modes without being limited to this example. For example, in the above described embodiment, the first protruded part 20 and the second protruded part 21 are formed on the undersurface of the contactor 11, but only the second protruded part 21 to be the support point on the occasion of bending the beam part 10a may be formed. The construction of the prober 1 and the construction of the probe card 2 other than the probe 10 are not limited to the ones of this embodiment, but may be other constructions. The bonding tool which joins the beam part 10a of the probe 10 to the connecting terminal 11c is not limited to the one that applies ultrasonic waves, but may be other kinds of tools. The present invention is also applicable to the case where the inspection objects are other substrates such as FPD (flat panel display), and a mask reticle for photomask other than the wafer W.

Figure 7:
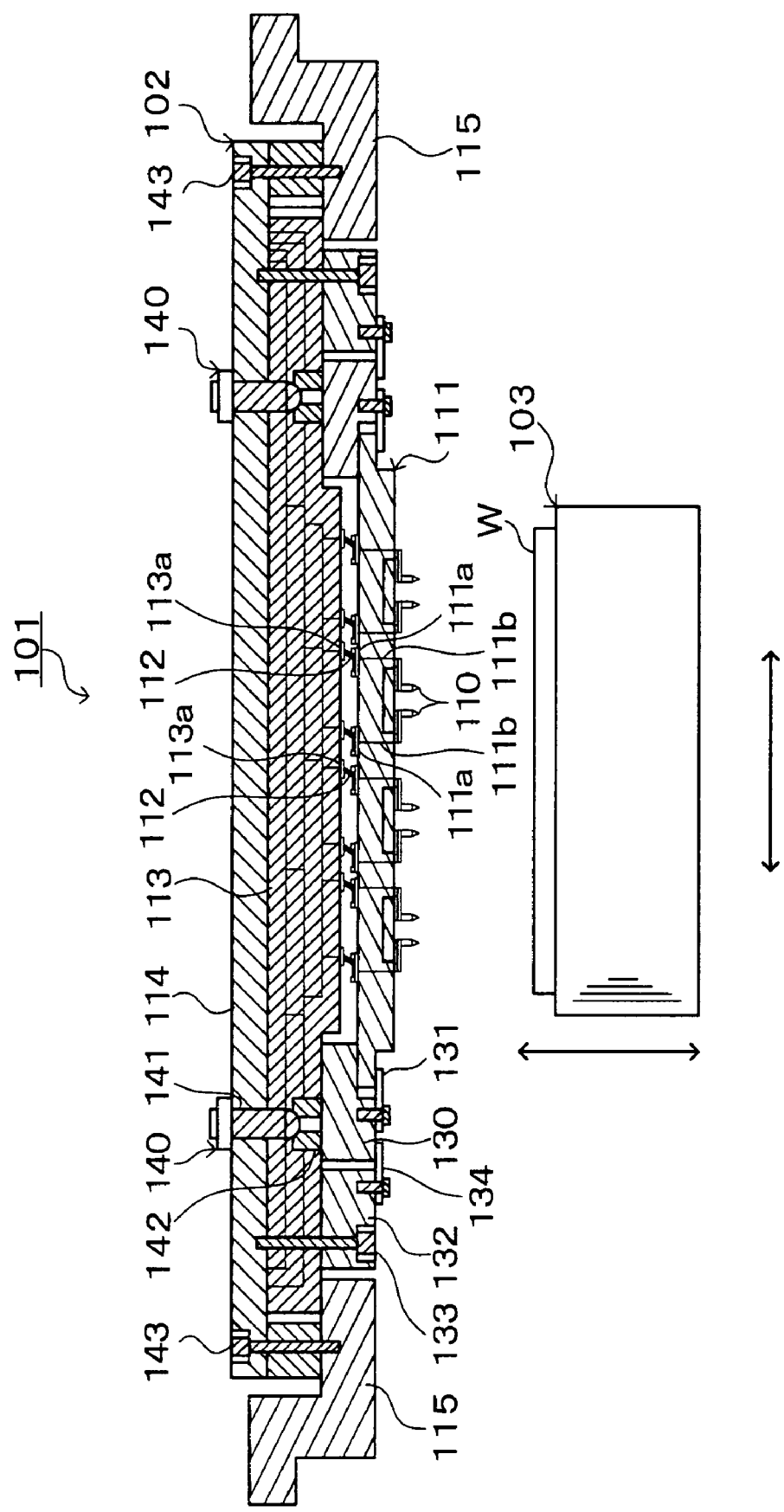
FIG. 7 is an explanatory view of a longitudinal section showing the outline of the construction of the prober.

Next, a second embodiment of the present invention will be described. FIG. 7 is an explanatory view of a longitudinal section showing an outline of a construction of an inside of a prober 101 to which a probe card according to this embodiment is fitted.

In the prober 101, for example, a probe card 102, and a mounting table 103 for mounting a wafer W as an inspection object are provided. The probe card 102 has its entire body formed into a substantially disk shape, for example. The probe card 102 includes a contactor 111 as a main body member which supports a plurality of probes 110, a printed wiring board 113 as a circuit board which is electrically connected to the contactor 111 by contact pins 112 as a plurality of connection pins, and a reinforcing member 114 which reinforces the printed wiring board 113. The probe card 102 is fitted to the prober 101 by a card holder 115, for example. In the second embodiment, the printed wiring board 113 corresponds to an external member.

The contactor 111 is formed into, for example, a substantially disk shape, and is provided under a lower side of the probe card 102 opposed to the mounting table 103. A plurality of probes 110 are joined to and supported at a predetermined position on an undersurface of the contactor 111. On a top surface of the contactor 111, a plurality of connecting terminals 111a are formed at the positions corresponding to the respective probes 110, and the probes 110 and the connecting terminals 111a are connected by connecting wires 111b passing through an inside of the contactor 111.

Figure 8:
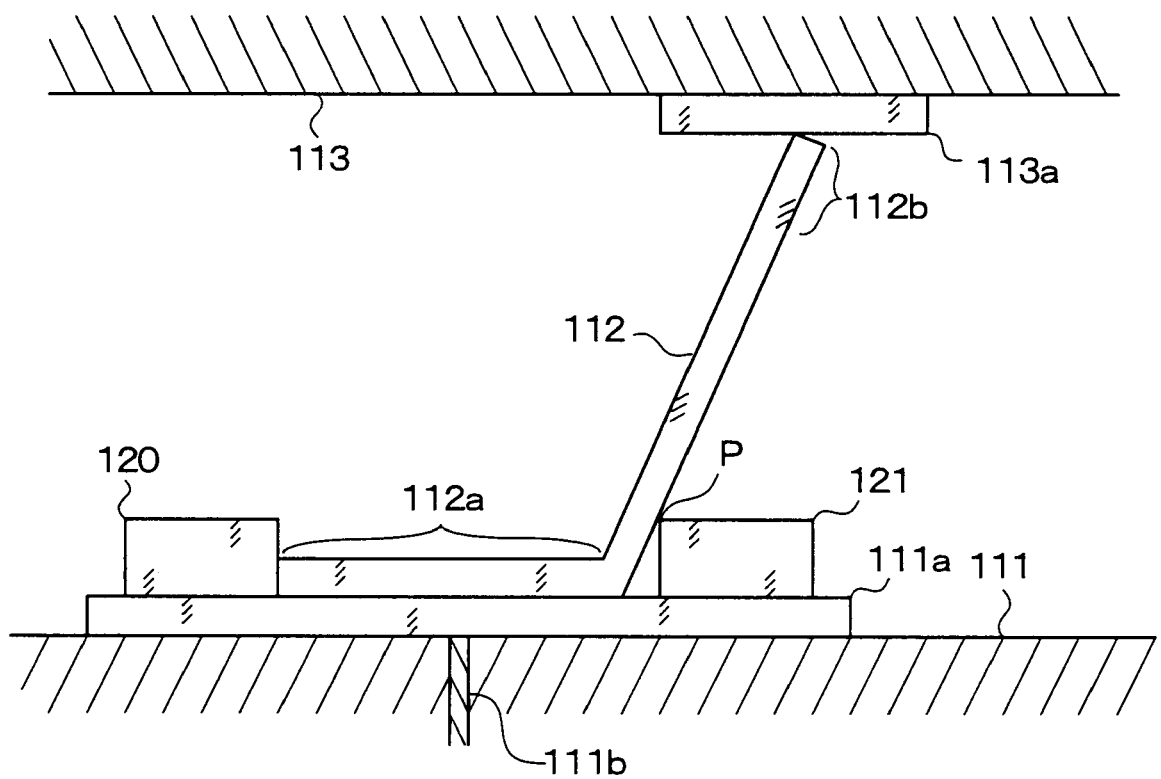
FIG. 8 is an explanatory view of a longitudinal section showing the construction of a mounting portion of a contact pin.

The printed wiring board 113 is formed into, for example, a substantially disk shape, and is disposed at an upper side of the contactor 111 to be parallel with the contactor 111. The printed wiring board 113 is disposed with a gap with a constant width provided between the printed wiring board 113 and the contactor 111. A plurality of contact pins 112 having elasticity and flexibility are provided in the gap between the printed wiring board 113 and the contactor 111. The contact pin 112 is formed by nickel having, for example, conductivity, and is formed into a plate shape of a length of 1.3 mm, a width of about 0.07 mm and a thickness of about 0.05 mm, for example. In the contact pin 112, for example, a lower end portion 112a is joined to the connecting terminal (electrode) 111a of the contactor 111, a portion to an upper end portion 112b side from the joint portion is bent to the printed wiring board 113 side, and the upper portion 112b is pressed to abut on the connecting terminal 113a of the printed wiring board 113, as shown in, for example, FIG. 8. The upper end portion 112b of the contact pin 112 is freely movable vertically and laterally while keeping contact with the printed wiring board 113. By the contact pin 112, electrical connection of the printed wiring electrode 113 and the contactor 111 is maintained.

Two of a first protruded part 120 and a second protruded part 121 spaced at a predetermined distance are formed on the connecting terminal 111a on the top surface of the contactor 111. The lower end portion 112a of the contact pin 112 is horizontally bonded over a predetermined width on the surface of the connecting terminal 111a between the first protruded part 120 and the second protruded part 121. An end surface at the lower end portion 112a side of the contact pin 112 abuts on an inner side surface of the first protruded part 120. A rear surface of an inclined portion of the contact pin 112 at the contactor 111 side is supported at the second protruded part 121 and a bent angle of the contact pin 112 is defined by the height of the second protruded part 121. The contact pin 112 can move in the vertical direction with a contact point P with the second protruded part 121 as a support point.

The reinforcing member 114 is provided to cover a top surface of, for example, the printed wiring board 113 to inhibit the printed wiring board 113 from thermally deforming.

As shown in FIG. 7, a first outer peripheral member 130 formed along an outer periphery of the contactor 111, for example, is disposed at the outer periphery of the contactor 111. A plate spring 131 which presses the contactor 111 to the printed wiring board 113 side and holds it is mounted to the first outer peripheral member 130. A second outer peripheral member 132 is further disposed at an outer periphery of the first outer peripheral member 130, for example. The second outer peripheral member 132 is fixed to the reinforcing member 114 by, for example, a bolt 133 which penetrates through the printed wiring board 113 from an undersurface of the second outer peripheral member 132 to reach the reinforcing member 114. A plate spring 134 which presses the first outer peripheral member 130 to the printed wiring board 113 side and holds it is mounted to the second outer peripheral member 132.

For example, a pressure regulating mechanism 140 is provided at a top surface of the reinforcing member 114. The pressure regulating mechanism 140 has, for example, bolts 141 which penetrate through the reinforcing member 114 from the top surface of the reinforcing member 114 to reach the printed wiring board 113, and receiving members 142 which are fixed to the top surface of the first outer peripheral member 130 and receive tip end portions of the bolts 141, at a plurality of spots. By turning the bolts 141, the height of the printed wiring board 113 is adjusted, and the contact pressure of the contact pin 112 and the printed wiring board 113 can be regulated. The reinforcing member 114 is fixed to the card holder 115 by bolts 143 provided at a plurality of spots of the outermost periphery of the reinforcing member 114.

The mounting table 103 is constructed to be movable, for example, laterally and vertically, and is capable of moving the wafer W mounted thereon three-dimensionally and bringing the probe 110 into contact with a desired position on the wafer W.

Figure 9:
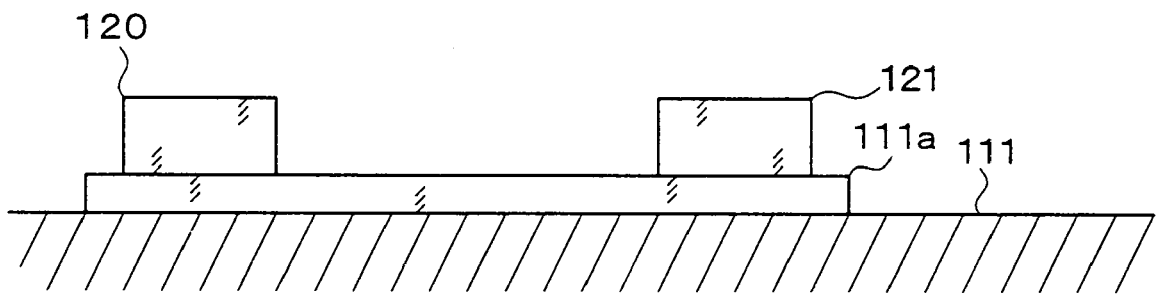
FIG. 9 is an explanatory view showing the state in which a protruded part is formed on a top surface of the contactor.

Next, a method for forming the above described probe card 102 will be described. First, a pair of the first protruded part 120 and the second protruded part 121 spaced at a constant distance are formed on the connecting terminal 111a of the contactor 111 as shown in, for example, FIG. 9. The first protruded part 120 and the second protruded part 121 are formed with a predetermined height at a predetermined space by using, for example, a photolithography technique. Plating of, for example, gold or the like is applied to the surfaces of the first protruded part 120 and the second protruded part 121.

Figure 10:
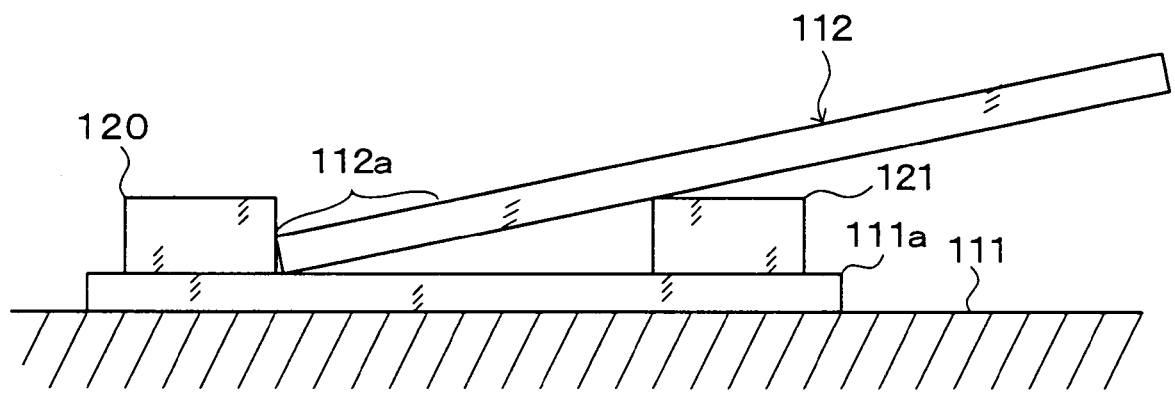
FIG. 10 is an explanatory view showing the state in which the contact pin is disposed on the top surface of the contactor.

After the first protruded part 120 and the second protruded part 121 are formed on the connecting terminal 111a, the contact pin 112 in the state in which it is linear and is not bent, for example, is disposed on the contactor 111 as shown in FIG. 10, the lower end portion 112a of the contact pin 112 is put into a recessed portion between the first protruded part 120 and the second protruded part 121, and the rear surface of the contact pin 112 is caused to abut on the second protruded part 121. Namely, the contact pin 112 is disposed to sandwich the second protruded part 121 between the contact pin and the surface of the contactor 111.

Figure 11:
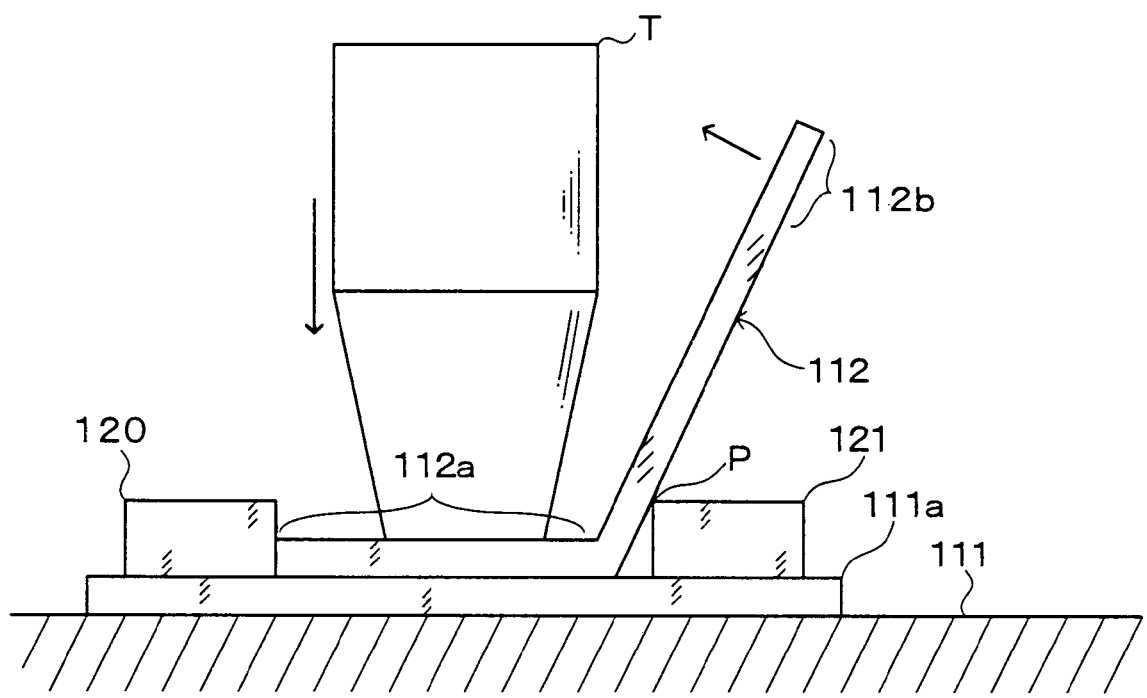
FIG. 11 is an explanatory view showing the state in which the contact pin is joined to the contactor with the bonding tool and is bent.

Thereafter, for example, an ultrasonic bonding tool T of, for example, a wire bonder is pressed against the lower end part 112a and its vicinity from an upper position side as shown in FIG. 11, and the lower end portion 112a of the contact pin 112 is joined to the connecting terminal 111a by applying supersonic waves. On this occasion, by pressure of the ultrasonic bonding tool T, the contact pin 112 is plastically deformed and bent with the contact point P of the contact pin 112 and the second protruded part 121 as the support point. When the ultrasonic bonding tool T is pressed against the lower end portion 112a of the contact pin 112, the end surface at the lower end portion 112a side of the contact pin 112 is pressed by the first protruded part 120 so that the contact pin 112 is prevented from displacing to the rear side.

After the contact pin 112 is joined to the contactor 111, and is bent at the upper end portion 112b side, the printed wiring board 113 is brought into close vicinity to the contact pin 112 from above the contactor 111, and the connecting terminal 113a of the printed wiring board 113 is brought into contact with the upper end portion 112b of the contact pin 112. Thus, a current can be passed through the printed wiring board 113, the contactor 111 and the probe 110.

When the wafer W is mounted on the mounting table 103 in the prober 101, and the electric characteristics of an electronic circuit on the wafer W are inspected by the probe card 102, for example, the wafer W is brought close to the contactor 111 in the state in which the wafer W is adjusted to a predetermined temperature, and each of the probes 110 is brought into contact with the surface of the wafer W. Even when flatness and horizontality of the printed wiring board 113 are reduced due to thermal expansion of, for example, of the printed wiring board 113, distortion and deflection of the printed wiring board 113 at this time are absorbed by a plurality of contact pins 112, and contact of the contact pins 112 and the printed wiring board 113 is maintained. As a result, transfer of the electric signals for inspection between the contactor 111 and the printed wiring board 113 is properly performed, and inspection of the electric characteristics by the probe 110 is properly performed. Since horizontality of the contactor 111 is kept without being influenced by deformation of the printed wiring board 113, each of the probes 110 of the contactor 1 is stably in contact with the surface of the wafer W.

According to the above embodiment, electrical contact between the contactor 111 and the printed wiring board 113 and absorption of deformation of the printed wiring board 113 due to thermal influence and the like can be realized with the simple construction by the contact pins 112 provided between the contactor 111 and the printed wiring board 113. Since the contact pin 112 does not take a space, the probe card 102 can be made compact.

When the contact pin 112 is mounted in the manufacture process of the probe card 102, the second protruded part 121 is formed on the top surface of the contactor 111, the lower end portion 112a of the contact pin 112 is pressed by the ultrasonic wave bonding tool T, and while the contact pin 112 is joined to the contactor 111, the contact pin 112 is bent with the contact point P of the contact pin 112 and the second protruded part 121 as the support point. Thereby, the probe card 102 having the contact pins 112 can be easily manufactured in a short time. Since the bent angle of the contact pin 112 depends on the height of the second protruded part 121, the bent angles of a plurality of contact pins 112 are made uniform, and thereby, the contact pins 112 in the same shapes can be formed. Therefore, contact pressure of each of the contact pins 112 and the printed wiring board 113 becomes constant, and contact of the contactor 111 and the printed wiring board 113 can be stabilized.

Further, the first protruded part 120 is formed on the top surface of the contactor 111, and therefore, the position of the contact pin 112 can be prevented from displacing on joining by the ultrasonic bonding tool T. As a result, the pressing position of the ultrasonic bonding tool T to the contact pin 112 and the joint position become constant, and the bent angle of the contact pin 112 becomes constant. Therefore, the shapes of a plurality of contact pins 112 can be precisely made equal.

One example of the second embodiment of the present invention is described above, but the present invention can adopt various modes without being limited to this example. For example, in the above described embodiment, the first protruded part 120 and the second protruded part 121 are formed on the to surface of the contactor 111, but only the second protruded part 121 to be the support point on the occasion of bending the contact pin 112 may be formed. The contact pin 112 is joined to the contactor 111 side, but it may be joined to the surface of the printed wiring board 113 at the contactor 111 side. In this case, the printed wiring board 113 is the main body member, and the contactor 111 is the external member. The construction of the prober 101 and the construction of the probe card 102 other than the contact pin 112 are not limited to those of this embodiment, but may be other constructions. The bonding tool used when joining the contact pin 112 to the contactor 111 is not limited to the one that applies ultrasonic waves, but may be other kinds of tools. The present invention is also applicable to the case where the inspection objects are other substrates such as an FPD (flat panel display), and a mask reticle for photomask other than the wafer W.

Figure 12:
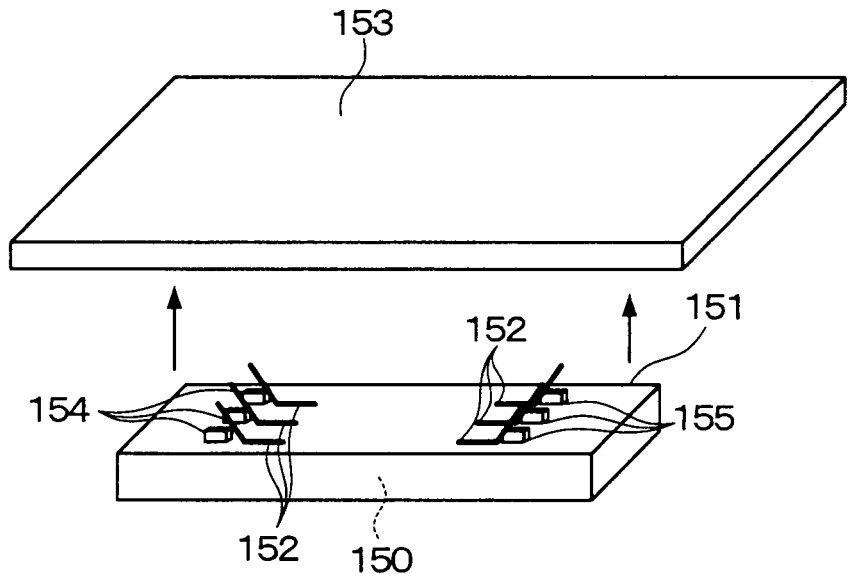
FIG. 12 is a perspective view of a package which seals an electronic device and a wiring board.
Figure 13:
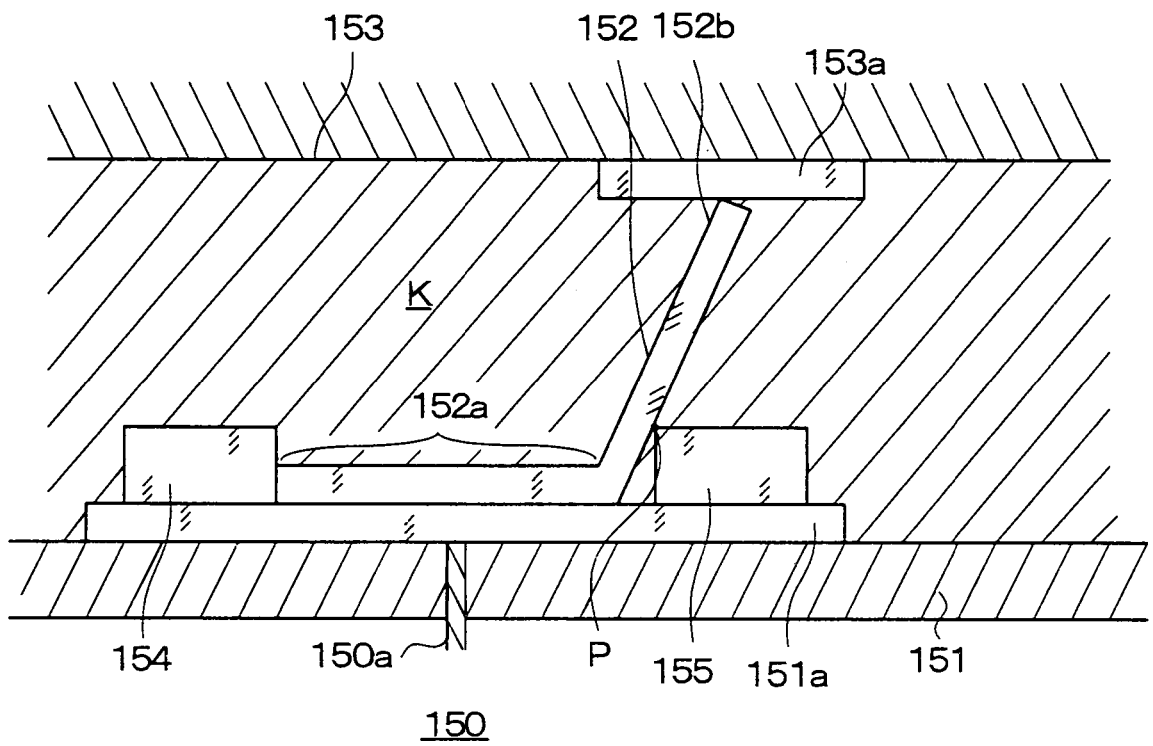
FIG. 13 is an explanatory view of the longitudinal section showing the construction of the mounting portion of the connection pin.

In the above embodiment, the connection pin provided at the probe card is described, but the connection pin in the present invention is not limited to the above described connection pin. For example, as a third embodiment of the present invention, it may be a connection pin which is connected to a surface of a package which covers an electronic device. FIG. 12 shows an example of such a connection pin, an electronic device 150 such as an MEMS (Micro Electro Mechanical System) and a CPU is sealed by a package 151 as a main body member, and a plurality of external electrodes 151a electrically connected to the electronic device 150 inside by a wire 150a are provided on the surface of the package 151. At the external electrodes 151a, a plurality of connection pins 152 having elasticity and flexibility are provided. Each of the connection pins 152 is formed by, for example, copper, nickel or the like having conductivity as shown in FIG. 13, and has a slim and long shape. In the connection pin 152, for example, a rear portion 152a is joined to the external electrode 151a of the package 151, and a portion at a tip end portion 152b side from the joint portion is bent to a wiring board 153 side as an external member.

Two of a first protruded part 154 and a second protruded part 155 spaced at a predetermined distance are formed on the external electrode 151a on the surface of the package 151. A side surface of the rear portion 152a of the connection pin 152 is joined to the surface of the external electrode 151a between the first protruded part 154 and the second protruded part 155. An end surface of the rear portion 152a of the connection pin 152 abuts on an inner side surface of the first protruded part 154. A rear surface of an inclined portion of the connection pin 152 at the package 151 side is supported on the second protruded part 155, and a bent angle of the connection pin 152 is defined by the height of the second protruded part 155. The connection pin 152 can move in the vertical direction with the contact point P with the second protruded part 155 as a support point.

When the package 151 of the electronic device 150 is mounted on the wiring board 153, the package 151 and the wiring board 153 are disposed to be opposed to each other, an adhesive such as, for example, a resin K having elasticity is filled between the package 151 and the wiring board 153, and the connection pin 152 is joined to a connecting terminal 153a of the wiring board 153. By the connection pin 152, electrical connection of the wiring board 153 and the electronic device 150 is maintained. Note that the package 151 and the wiring board 153 are gripped with a clamp and fixed, and the tip end portion 152b of the connection pin 152 may be caused to abut on the connecting terminal 153a of the wiring board 153 in such a manner as to sandwich the connection pin 152 between the package 151 and the wiring board 153.

Figure 14:
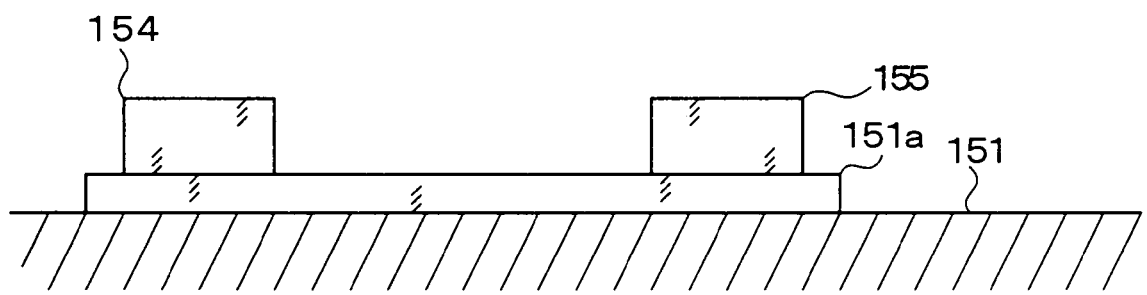
FIG. 14 is an explanatory view showing the state in which the protruded part is formed on the surface of the package.

Next, a method for forming the above described connection pin 152 will be described. First, a pair of first protruded part 154 and a second protruded part 155 spaced at a constant distance is formed on the surface of each of the external electrodes 151a of the package 151 as shown in, for example, FIG. 14. The first protruded part 154 and the second protruded part 155 are formed with a predetermined height at a predetermined space by using a photolithography technique as in formation of an ordinary bump or the like, for example. The first protruded part 154 and the second protruded part 155 are formed by using, for example, the same material as that of the connection pin 152, or a material harder than it, and plating of gold or the like is applied to their surfaces.

Figure 15:
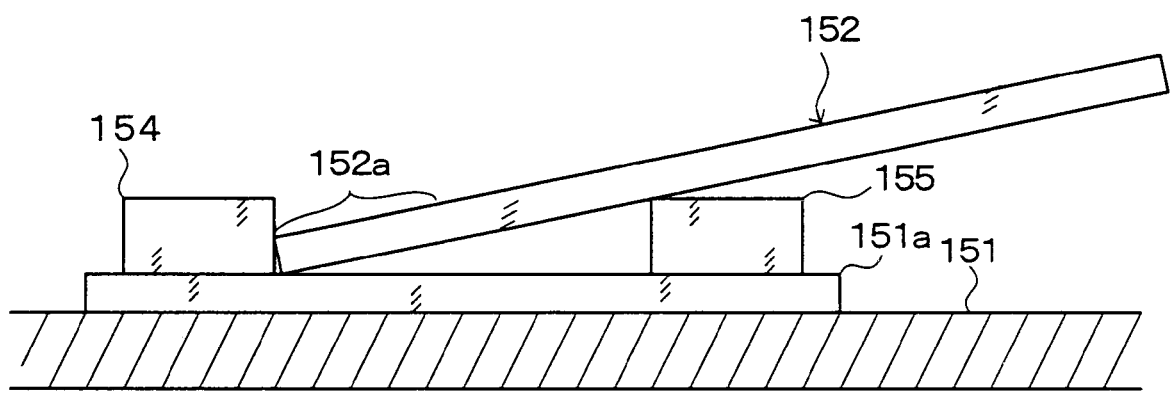
FIG. 15 is an explanatory view showing the state in which the connection pin is disposed on the surface of the package.

Thereafter, as shown in FIG. 15, the connection pin 152, for example, in a state in which it is linear and is not bent is disposed on the package 151, the rear portion 152a side of the connection pin 152 is put into a recessed portion between the first protruded part 154 and the second protruded part 155, and the rear surface of the connection pin 152 is caused to abut on the second protruded part 155. Namely, the connection pin 152 is disposed so as to sandwich the second protruded part 155 between the connection pin 152 and the surface of the package 151.

Figure 16:
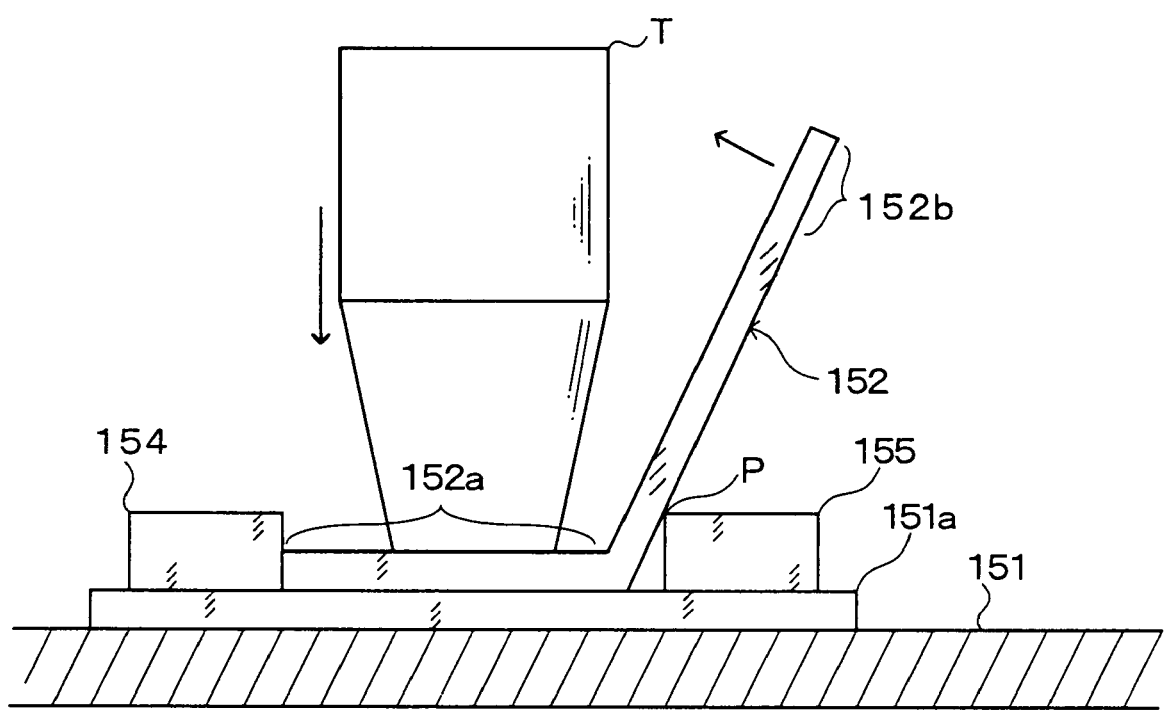
FIG. 16 is an explanatory view showing the state in which the connection pin is joined to the package with the bonding tool, and is bent.
Figure 17:
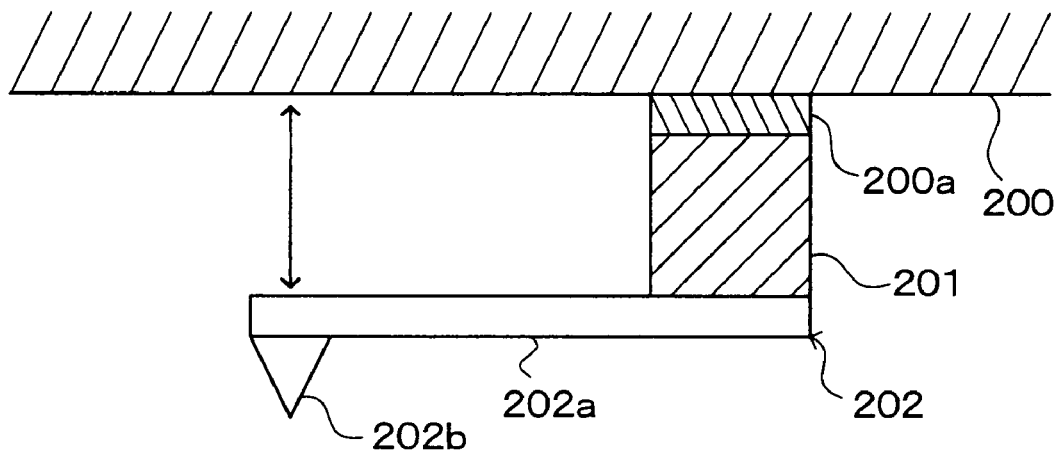
FIG. 17 is an explanatory view of a longitudinal section showing a construction example of the mounting portion of the conventional probe.
Figure 18:
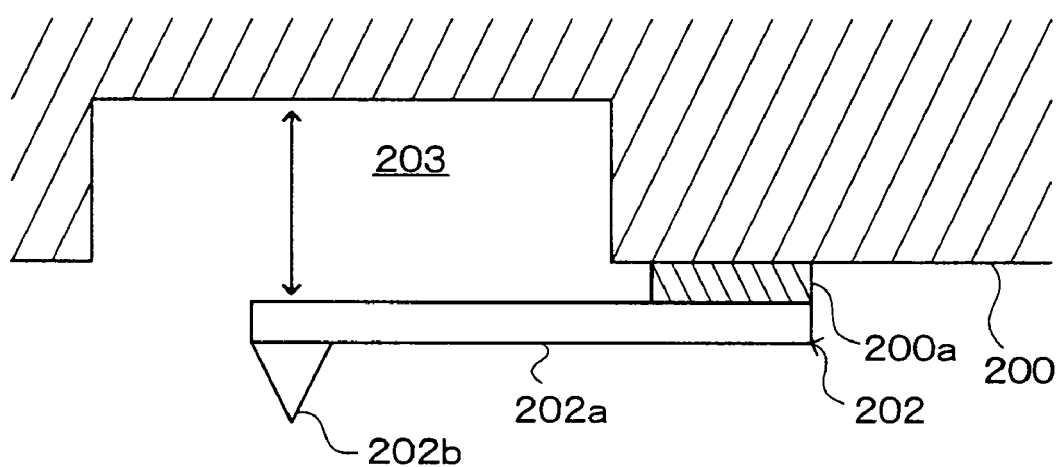
FIG. 18 is an explanatory view of a longitudinal section showing another construction example of the mounting portion of the conventional probe.

Thereafter, as shown in FIG. 16, for example, the ultrasonic bonding tool T of, for example, a wire bonding is pressed against the rear portion 152a and its vicinity of the connection pin 152 from an upper position side, and the rear portion 152a of the connection pin 152 is joined to the external electrode 151a by applying supersonic waves. On this occasion, by pressure of the ultrasonic bonding tool T, the contact pin 152 is elastically deformed and bent with the contact point P of the connection pin 152 and the second protruded part 155 as a support point. When the ultrasonic bonding tool T is pressed against the rear portion 152a of the connection pin 152, the end surface at the rear portion 152a side of the connection pin 152 is pressed by the first protruded part 154, and the connection pin 152 is prevented from displacing to the rear side.

According to this embodiment, the package 151 and the wiring board 153 are electrically connected via the connection pin 152, and therefore, distortion which occurs to, for example, the package 151 and the wiring board 153 can be absorbed by the connection pin 152. As a result, disconnection between the package 151 and the wiring board 153 can be prevented.

One example of the third embodiment of the present invention is described above, but the present invention is not limited to this example, and can adopt various kinds of modes. For example, in the above described embodiment, the first protruded part 154 and the second protruded part 155 are formed on the surface of the package 151, but only the second protruded part 155 that becomes the support point on the occasion of bending the connection pin 152 may be formed. The bonding tool which joins the connection pin 152 to the external electrode 151a is not limited to the one that applies ultrasonic waves, but may be other kinds of tools.

INDUSTRIAL AVAILABILITY

The present invention is useful when securing a space allowing a contact of a probe to move with the simple construction. The present invention is useful when realizing a compact probe card which has a simple construction and is easy to manufacture.

The invention claimed is:

1. A method for forming a connection pin connected to an electrode on a surface of a main body member to achieve electrical continuity between the main body member and an external member opposed to the main body member, comprising the steps of:

forming a protruded part on the surface of the main body member;

disposing a connection pin on said protruded part on the surface of said main body member, pressing a bonding tool for joining against a rear portion of the connection pin from a side of said external member, and while joining the rear portion of the connection pin to the electrode on the surface of the main body member, bending a tip end portion of said connection pin to the side of said external member with a contact point of said connection pin and said protruded part as a support point; and forming, on the surface of said main body member, another protruded part which holds an end surface of the rear portion of said connection pin so that a position of said connection pin does not displace to a rear side when the rear portion of the connection pin is pressed by said bonding tool.

2. The method for forming a connection pin according to claim 1, wherein said connection pin is used for a probe card having a contactor supporting a probe on one surface, and a circuit board which is opposed to the other surface of the contactor and electrically connected to the contactor, said main body member is said contactor, said external member is said circuit board which is disposed with a gap provided between the circuit board and the other surface of said contactor, said protruded part is formed on the other surface of the contactor, and the connection pin is disposed on said protruded part on the other surface of said contactor, the bonding tool for joining is pressed against the rear portion of the connection pin from the circuit board side, and while the rear portion of the connection pin is joined to the other surface of the contactor, said connection pin is bent so that the tip end portion of said connection pin inclines to the circuit board side with the contact point of said connection pin and said protruded part as the support point.

3. The method for forming a connection pin according to claim 1, wherein said connection pin is used for a probe card having a contactor supporting a probe on one surface, and a circuit board which is opposed to the other surface of the contactor and electrically connected to the contactor, said external member is said contactor, said main body member is said circuit board which is disposed with a gap provided between the circuit board and the other surface of said contactor, said protruded part is formed on a surface of the circuit board at a contactor side, the connection pin is disposed on said protruded part on the surface of said circuit board at the contactor side, the bonding tool for joining is pressed against the rear portion of the connection pin from the contactor side, and while the rear portion of the connection pin is joined to the surface of the circuit board at the contactor side, said connection pin is bent so that the tip end portion of said connection pin inclines to the contactor side with the contact point of said connection pin and said protruded part as the support point.

4. A connection pin disposed in a gap between a contactor and a circuit board and electrically connecting the contactor and the circuit board, in a probe card having the contactor supporting a probe on one surface and the circuit board opposed to the other surface of the contactor and electrically connected to the contactor, wherein said connection pin is formed by the following forming method, and said forming method has the steps of:

forming a protruded part on the other surface of the contactor;

disposing the connection pin on said protruded part on the other surface of said contactor, pressing a bonding tool for joining against a rear portion of the connection pin from a circuit board side, and while joining the rear portion of the connection pin to the other surface of the contactor, bending said connection pin so that a tip end portion of said connection pin inclines to the circuit board side with a contact point of said connection pin and said protruded part as a support point; and forming, on the other surface of said contactor, another protruded part which holds an end surface of the rear portion of said connection pin so that a position of said connection pin does not displace to a rear side when the rear portion of the connection pin is pressed by said bonding tool.

5. A connection pin disposed in a gap between a contactor and a circuit board and electrically connecting the contactor and the circuit board, in a probe card having the contactor supporting a probe on one surface and the circuit board opposed to the other surface of the contactor and electrically connected to the contactor, wherein said connection pin is formed by the following forming method, and said forming method has the steps of:

forming a protruded part on a surface of the circuit board at a contactor side;

disposing the connection pin on said protruded part on the surface of said circuit board at the contactor side, pressing a bonding tool for joining against a rear portion of the connection pin from the contactor side, and while joining the rear portion of the connection pin to the surface of the circuit board at the contactor side, bending said connection pin so that a tip end portion of said connection pin inclines to the contactor side with a contact point of said connection pin and said protruded part as a support point; and forming, on the surface of said circuit board at the contactor side, another protruded part which holds an end surface of the rear portion of said connection pin so that a position of said connection pin does not displace to a rear side when the rear portion of the connection pin is pressed by said bonding tool.

6. A probe card having a contactor supporting a probe on one surface, and a circuit board opposed to the other surface of the contactor and electrically connected to the contactor, wherein a gap is formed between the contactor and the circuit board, a connection pin which electrically connects the contactor and the circuit board and has elasticity is provided at said gap, said connection pin has one end portion joined to the other surface of said contactor, and the other end portion pressed to abut on a surface of said circuit board at a contactor side, said connection pin has the one end portion joined along the other surface of said contactor, and the other end portion side from the one end portion is bent to a side of said circuit board, and a protruded part which is in contact with a rear surface of said connection pin which is bended at a contactor side, and another protruded part which holds an end surface of said connection pin at the one end portion side are formed on the other surface of said contactor.

7. A method for manufacturing a probe card having a contactor supporting a probe on one surface and a circuit board opposed to the other surface of the contactor and electrically connected to the contactor, comprising the steps of:

forming a protruded part on the other surface of the contactor;

disposing the connection pin on said protruded part on the other surface of said contactor, pressing a bonding tool for joining against one end portion of the connection pin from a circuit board side, and while joining the one end portion of the connection pin to the other surface of the contactor, bending said connection pin so that the other end portion of said connection pin inclines to the circuit board side with a contact point of said connection pin and said protruded part as a support point;

bringing said circuit board into contact with the other end portion of said connection pin; and forming, on the other surface of said contactor, another protruded part which holds an end surface of said connection pin at one end portion side so that a position of said connection pin does not displace to the one end portion side when the one end portion of the connection pin is pressed by said bonding tool.

* * * * *

UNITED STATES PATENT AND TRADEMARK OFFICE
CERTIFICATE OF CORRECTION

| | | |
|---|---|---|
| PATENT NO. | : 7,629,806 B2 | Page 1 of 1 |
| APPLICATION NO. | : 11/885936 | |
| DATED | : December 8, 2009 | |
| INVENTOR(S) | : Hisatomi Hosaka | |

It is certified that error appears in the above-identified patent and that said Letters Patent is hereby corrected as shown below:

On the title page, item (74), line 2, "Farrabow," should read --Farabow,--;

item (57), line 7, "contractor" should read --contactor--.

Signed and Sealed this

Second Day of February, 2010

David J. Kappos
*Director of the United States Patent and Trademark Office*